US011955555B2

United States Patent
Badarneh et al.

(10) Patent No.: US 11,955,555 B2
(45) Date of Patent: Apr. 9, 2024

(54) FIELD EFFECT TRANSISTORS WITH REDUCED LEAKAGE CURRENT

(71) Applicant: Newport Fab, LLC, Newport Beach, CA (US)

(72) Inventors: Rula Badarneh, Irvine, CA (US); Roda Kanawati, Irvine, CA (US); Kurt Moen, Tustin, CA (US); Paul D. Hurwitz, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 68 days.

(21) Appl. No.: 17/833,583

(22) Filed: Jun. 6, 2022

(65) Prior Publication Data

US 2023/0395722 A1 Dec. 7, 2023

(51) Int. Cl.
*H01L 29/786* (2006.01)
*H01L 21/762* (2006.01)
*H01L 27/12* (2006.01)
*H01L 29/40* (2006.01)

(52) U.S. Cl.
CPC .. *H01L 29/78609* (2013.01); *H01L 21/76202* (2013.01); *H01L 21/76224* (2013.01); *H01L 27/1203* (2013.01); *H01L 29/402* (2013.01)

(58) Field of Classification Search
CPC ......... H01L 29/78609; H01L 21/76202; H01L 29/402; H01L 27/1203; H01L 21/76224; H01L 29/1087; H01L 29/78615
USPC .......................................... 257/394; 438/225
See application file for complete search history.

(56) References Cited

U.S. PATENT DOCUMENTS

2017/0162705 A1* 6/2017 Gorbachov et al. ........................ H01L 29/76809

* cited by examiner

*Primary Examiner* — Thinh T Nguyen
(74) *Attorney, Agent, or Firm* — Farjami & Farjami LLP

(57) ABSTRACT

A field effect transistor (FET) includes an active region including a source region, a drain region, and a channel region. The channel region is under a gate and situated between the source region and the drain region. A field region is next to the active region. The channel region has an interface with the field region. The gate has a wide outer gate segment proximate to the interface and a narrow inner gate segment distant from the interface. The wide outer gate segment produces an outer channel length greater than an inner channel length that is produced from the narrow inner gate segment, thereby reducing a leakage current of the FET during an OFF state.

19 Claims, 5 Drawing Sheets

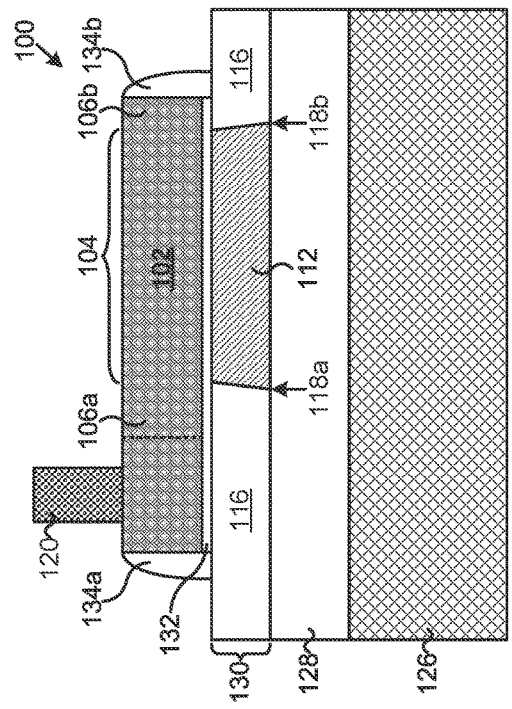
FIG. 1A -Prior Art-
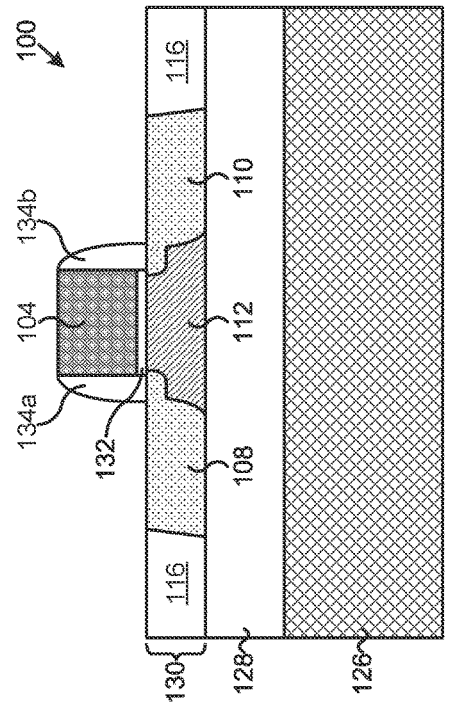
FIG. 1B -Prior Art-
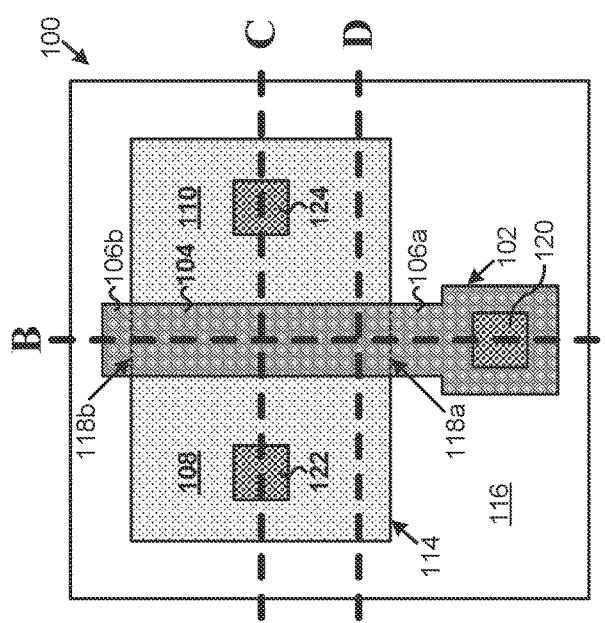
FIG. 1C -Prior Art-
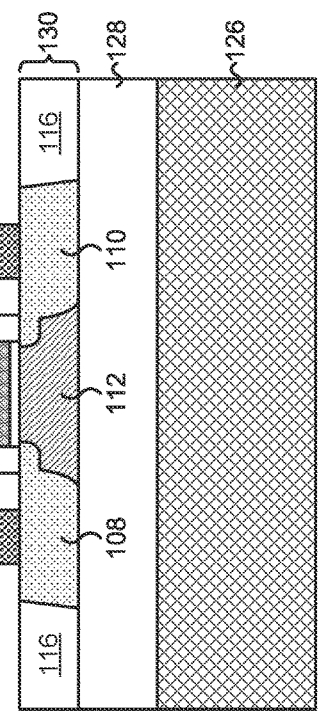
FIG. 1D -Prior Art-

FIELD EFFECT TRANSISTORS WITH REDUCED LEAKAGE CURRENT

BACKGROUND

Field effect transistors (FETs) are commonly utilized in electronics devices, for example in digital blocks of radio frequency (RF) systems. FETs are often surrounded by dielectric field regions to provide insulation and reduce RF noise. FETs can also be formed in semiconductor-on-insulator (SOI) substrates in order to further provide insulation and reduce RF noise.

However, field leakage currents at edges of channel regions interfacing the field regions are undesirable and need be minimized. Leakage currents can disadvantageously result in increased power consumption and quicker battery drain. Moreover, leakage currents are particularly concerning for SOI device structures due to the use of thin semiconductor layers. Conventional techniques for reducing leakage current can result in significant performance tradeoffs, such as reduced saturation drain current. Accordingly, fabricating FETs with reduced field leakage current and without significant performance tradeoffs becomes difficult and complex.

Thus, there is a need in the art for FETs that have reduced field leakage current and improved performance parameters with fewer tradeoffs.

SUMMARY

The present disclosure is directed to field effect transistors with reduced leakage current, substantially as shown in and/or described in connection with at least one of the figures, and as set forth in the claims.

BRIEF DESCRIPTION OF THE DRAWINGS

FIG. 1A illustrates an exemplary plan view of a field effect transistor (FET).

FIG. 1B illustrates an exemplary cross-sectional view of the FET of FIG. 1A.

FIG. 1C illustrates an exemplary cross-sectional view of the FET of FIG. 1A.

FIG. 1D illustrates an exemplary cross-sectional view of the FET of FIG. 1A.

DETAILED DESCRIPTION

Figure 2A:
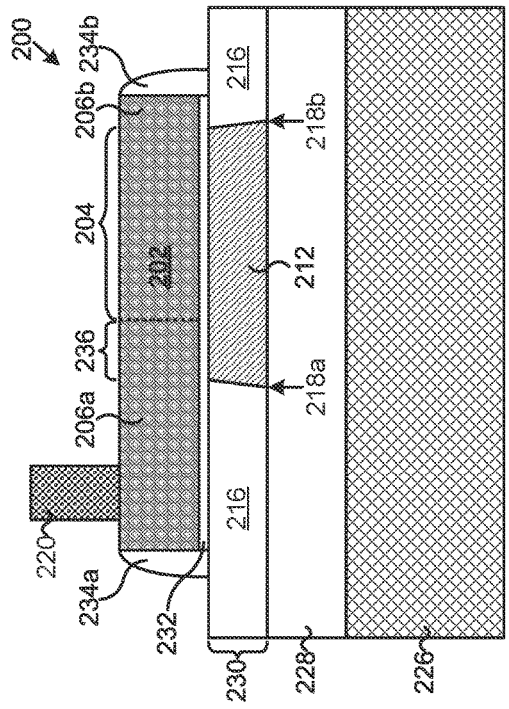
FIG. 2A illustrates an exemplary plan view of a FET according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1A illustrates an exemplary plan view of field effect transistor (FET) 100. FIGS. 1B, 1C, and 1D illustrate exemplary cross-sectional views of FET 100 along lines B, C, and D, respectively, in FIG. 1A. In other words, FIG. 1B illustrates an exemplary cross-sectional view of FET 100 along line B in FIG. 1A, FIG. 1C illustrates an exemplary cross-sectional view of FET 100 along line C in FIG. 1A, and FIG. 1D illustrates an exemplary cross-sectional view of FET 100 along line D in FIG. 1A. FET 100 in FIGS. 1A, 1B, 1C, and 1D represents a conventional FET.

As shown in FIG. 1A, FET 100 includes gate 102, source region 108, and drain region 110. Gate 102 includes inner gate segment 104 and field gate segments 106a and 106b. Inner gate segment 104 of gate 102 is situated over a channel region, which is situated between source region 108 and drain region 110. Channel region 112 situated under inner gate segment 104 of gate 102 and between source region 108 and drain region 110 is shown in FIGS. 1B, 1C, and 1D. Source region 108, drain region 110, and channel region 112 together make up active region 114 of FET 100.

FET 100 also includes field region 116 situated next to active region 114. Field region 116 serves to isolate active region 114 of FET 100 from neighboring devices. In various implementations field region 116 may comprise a shallow trench isolation (STI) region, a local oxidation of silicon (LOCOS) region, or a thermally grown oxide region. In the present implementation, field region 116 is shown as a continuous region surrounding active region 114. In other implementations, FET 100 can include multiple field regions next to active region 114.

Channel region 112, shown in FIGS. 1B, 1C, and 1D, has interfaces 118a and 118b with field region 116. Interfaces 118a and 118b, which underlie gate 102, are illustrated by dotted lines in the plan view of FIG. 1A. Interfaces 118a and 118b of channel region 112 with field region 116 are also shown in FIG. 1B. Interfaces 118a and 118b can be a source of edge leakage current, as described below.

As shown in FIGS. 1A and 1B, gate 102 includes field gate segments 106a and 106b situated over field region 116. Field gate segment 106a is situated over field region 116 proximate to interface 118a, and field gate segment 106b is situated over field region 116 proximate to interface 118b. Inner gate segment 104 situated over active region 114 is contiguous with field gate segments 106a and 106b situated over field region 116. Proximate to interface 118a, inner gate segment 104 has a same width as field gate segment 106a. Further from interface 118a, field gate segment 106a is wider than inner gate segment 104, so field gate segment 106a functions as a landing pad for gate contact 120. Inner gate segment 104 has a same width as field gate segment 106b.

As shown in FIGS. 1A and 1B, gate contact 120 is situated over and contacts field gate segment 106a. As shown in FIGS. 1A and 1C, source contact 122 is situated over and contacts source region 108, and drain contact 124 is situated over and contacts drain region 110. Gate contact 120, source contact 122, and drain contact 124 may be any contacts known in the art. In various implementations, gate contact 120, source contact 122, and drain contact 124 may comprise copper, tungsten, or any other suitable metal.

As shown in FIGS. 1B, 1C, and 1D, in the present implementation, FET 100 is implemented in a silicon-on-insulator (SOI) structure including substrate 126, buried oxide (BOX) 128, and semiconductor layer 128. Semiconductor layer 130 is situated over BOX 128, and BOX 128 is situated over substrate 126. In providing the SOT structure, a bonded and etch back SOI (BESOI) process can be used, as known in the art. In a BESOI process, substrate 126, BOX 128, and semiconductor layer 128 together form an SOI structure. Alternatively, as also known in the art, a SIMOX process (separation by implantation of oxygen process) or a "smart cut" process can also be used for providing the SOI structure. In a SIMOX process, substrate 126 can be a bulk silicon support wafer (which may also be referred to as a "handle wafer" in the present application). Similar to a BESOI process, in both SIMOX and smart cut processes, substrate 126, BOX 128, and semiconductor layer 128 together form an SOI structure.

In one implementation, substrate 126 is undoped bulk silicon. In various implementations, substrate 126 can comprise germanium, group III-V material, or any other suitable handle material. In various implementations, substrate 126 has a thickness of approximately seven hundred microns (700 μm) or greater or less. In one implementation, a trap rich layer can be situated between substrate 126 and BOX 128. In various implementations, BOX 128 typically comprises silicon dioxide ($SiO_2$), but it may also comprise silicon nitride ($Si_xN_y$), or another insulator material. In various implementations, BOX 128 has a thickness of approximately one micron (1 μm) or greater or less. In one implementation, semiconductor layer 130 includes monocrystalline silicon. In various implementations, semiconductor layer 130 can comprise germanium, group III-V material, or any other semiconductor material. In various implementations, semiconductor layer 130 has a thickness of approximately three hundred nanometers (300 nm) or greater or less. Substrate 126, BOX 128, and semiconductor layer 128 can be provided together as a pre-fabricated SOI substrate.

Active region 114 (shown in FIG. 1A), which including source region 108, drain region 110, and channel region 112 (shown in FIGS. 1B, 1C, and 1D), is situated in semiconductor layer 130 over BOX 128. In one implementation, source region 108 and drain region 110 may be regions in semiconductor layer 130 comprising N-type dopants, such as phosphorus, for example, and may be formed in a manner known in the art. In one implementation, channel region 112 may be a lightly-doped P-type region in semiconductor layer 130. In the present implementation, source region 108 and drain region 110 extend to BOX 128. In other implementations, source region 108 and drain region 110 may extend shallower in semiconductor layer 130.

In FET 100, source region 108, drain region 110, and channel region 112 are surrounded by field region 116. In the present implementation, field region 116 is illustrated as an STI region extending to BOX 128 in FIGS. 1B, 1C, and 1D. In various implementations, field region 116 may comprise a LOCOS region or a thermally grown oxide region, and may have different extent and/or appearance than illustrated in FIGS. 1B, 1C, and 1D.

Gate oxide 132 is situated on semiconductor layer 130 over channel region 112. Gate oxide 132 may comprise, for example, silicon dioxide ($SiO_2$) or another dielectric. Gate 102 is situated over gate oxide 132. Inner gate segment 104 of gate 102 is situated over channel region 112, and gate segments 106a and 106b of gate 102 are situated over field region 116. Gate 102 may comprise polycrystalline silicon (polysilicon) or a conductive metal. Dielectric spacers 134a and 134b are situated on sides of gate 102. Dielectric spacers 134a and 134b may comprise, for example, silicon nitride. For clarity, dielectric spacers 134a and 134b are not shown in the plan view of FIG. 1A. FET 100 may have additional features known in the art but not specifically referred to in the present application, such as lightly-doped drains and silicided terminals.

FIG. 1C represents an exemplary cross-section along line C in FIG. 1A, approximately along the center of channel region 112 or inner gate segment 104 in FIGS. 1A and 1B. FIG. 1D represents an exemplary cross-section along line D in FIG. 1A, proximate to interface 118a shown in FIGS. 1A and 1B, i.e., proximate to an edge of channel region 112. Other than source contact 122 and drain contact 124 being visible in FIG. 1C, the cross-sections in FIGS. 1C and 1D are substantially the same. In particular, the width of inner gate segment of gate 102 is substantially the same both proximate to and distant from interface 118a. A conductive path can form at interface 118a when FET 100 is an OFF state, allowing current to leak through. Such leakage current of FET 100 can result in increased power consumption, for example, where FET 100 is implemented in a digital block. A similar leakage current can form at interface 118b.

Figure 2B:
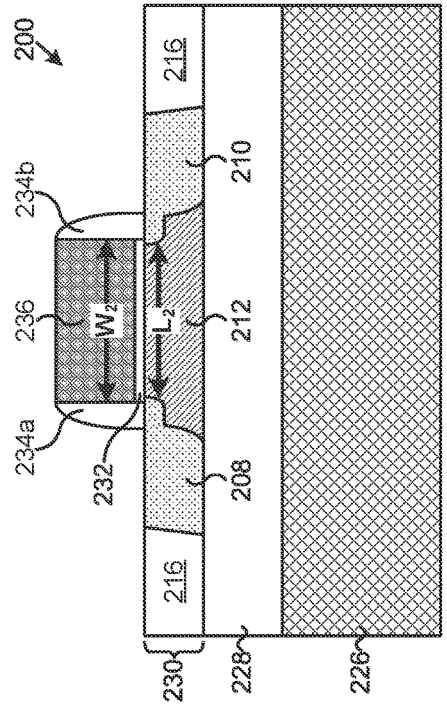
FIG. 2B illustrates an exemplary cross-sectional view of the FET of FIG. 2A according to one implementation of the present application.
Figure 2C:
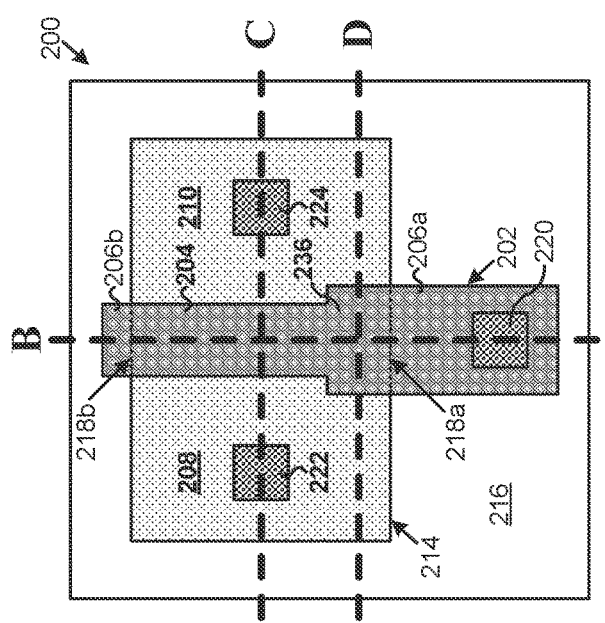
FIG. 2C illustrates an exemplary cross-sectional view of the FET of FIG. 2A according to one implementation of the present application.
Figure 2D:
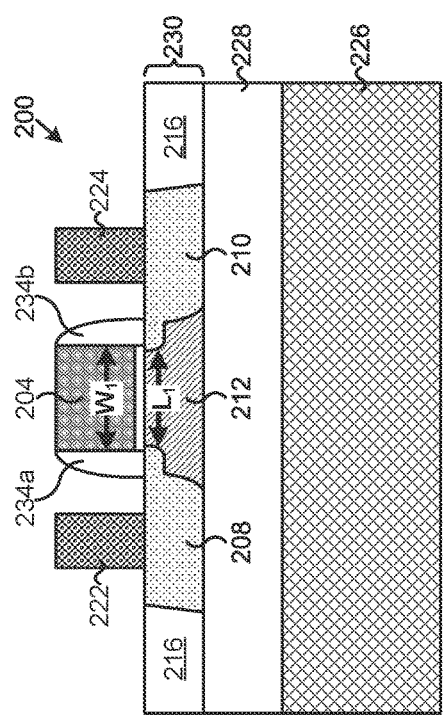
FIG. 2D illustrates an exemplary cross-sectional view of the FET of FIG. 2A according to one implementation of the present application.

FIG. 2A illustrates an exemplary plan view of FET 200 according to one implementation of the present application. FIGS. 2B, 2C, and 2D illustrate exemplary cross-sectional views of FET 200 along lines B, C, and D, respectively, in FIG. 2A. In other words, FIG. 2B illustrates an exemplary cross-sectional view of FET 200 along line B in FIG. 2A, FIG. 2C illustrates an exemplary cross-sectional view of FET 200 along line C in FIG. 2A, and FIG. 2D illustrates an exemplary cross-sectional view of FET 200 along line D in FIG. 2A. Except for differences noted below, FET 200, gate 202, narrow inner gate segment 204, field gate segments 206a and 206b, source region 208, drain region 210, channel region 212, active region 214, field region 216, interfaces 218a and 218b, gate contact 220, source contact 222, drain contact 224, substrate 226, BOX 228, semiconductor layer 230, gate oxide 232, and dielectric spacers 234a and 234b in FIGS. 2A through 2D generally correspond to FET 100, gate 102, inner gate segment 104, field gate segments 106a and 106b, source region 108, drain region 110, channel region 112, active region 114, field region 116, interfaces 118a and 118b, gate contact 120, source contact 122, drain contact 124, substrate 126, BOX 128, semiconductor layer 130, gate oxide 132, and dielectric spacers 134a and 134b in FIGS. 1A through 1D, and may have any implementations described above.

As shown in FIGS. 2A through 2D, gate 202 has a wide outer gate segment 236 proximate to interface 218a. That is, wide outer gate segment 236 is situated over channel region 212 at interface 218a, and overlaps a portion of the width of channel region 212. Gate 202 also has a narrow inner gate segment 204 distant from interface 218a. For example, gate 202 is situated over channel region 212 proximate to its center and over channel region 212 proximate to interface 218b opposite interface 218a.

Wide outer gate segment 236 has width $W_2$ shown in FIG. 2D, which is greater than width $W_1$ of narrow inner gate segment 204 shown in FIG. 2C. In channel region 212, wide outer gate segment 236 produces an outer channel length $L_2$ greater than an inner channel length $L_1$ that is produced from narrow inner gate segment 204. Outer channel length $L_2$ reduces a leakage current of FET 200, as discussed further below.

As shown in FIGS. 2A and 2B, wide outer gate segment 236 is contiguous with field gate segment 206a situated over said field region 216. Referring back to FET 100 in FIG. 1A, field gate segment 106a had two distinct widths, a first narrow width proximate to interface 118a and a second wide width around gate contact 120. In contrast, in FET 200 in FIG. 2A, field gate segment 206a has a single uniform width both proximate to interface 218a and around gate contact 220.

Figure 2E:
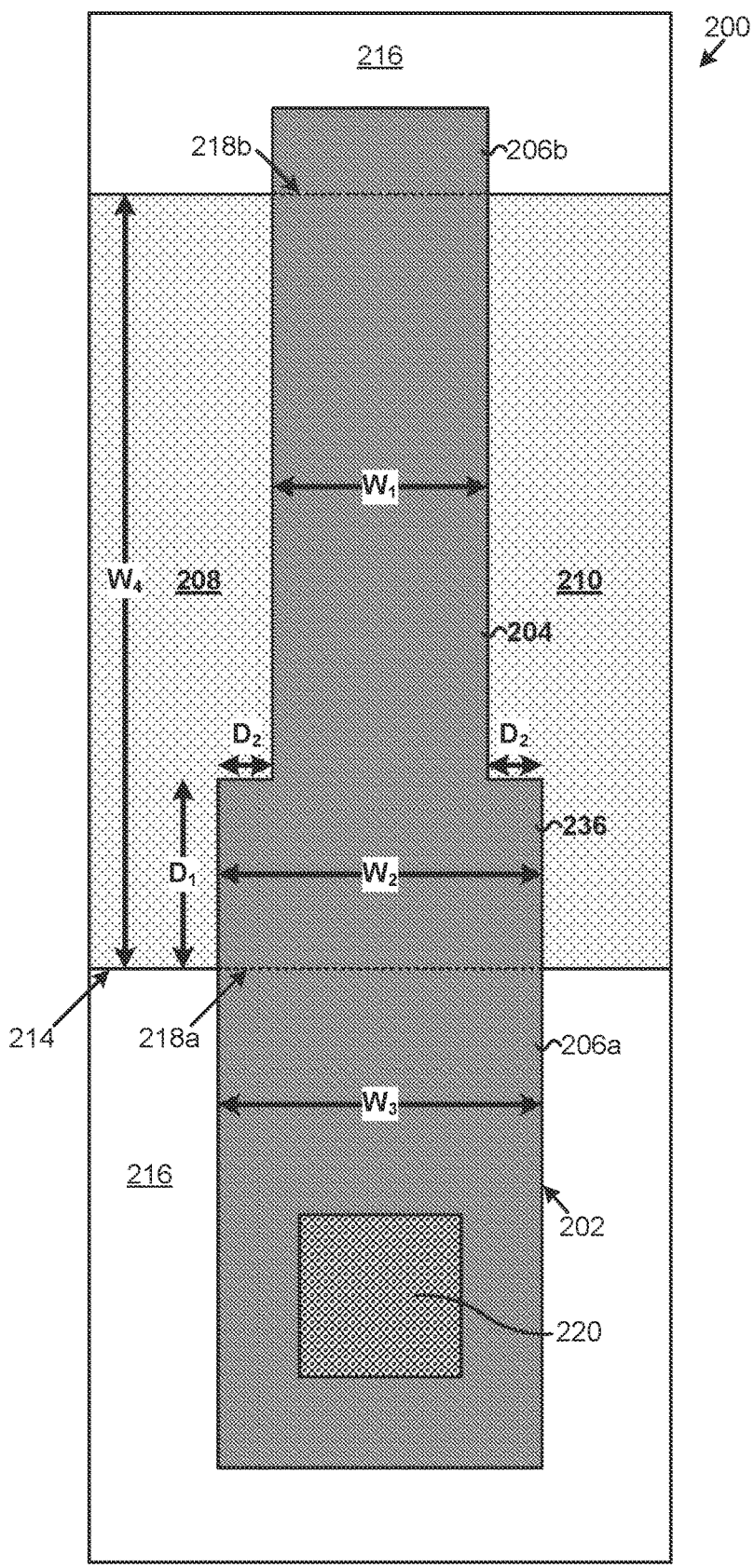
FIG. 2E illustrates an enlarged plan view of a portion of the FET of FIG. 2A according to one implementation of the present application.

FIG. 2E illustrates an enlarged plan view of a portion of FET 200 of FIG. 2A according to one implementation of the present application. FET 200, gate 202, narrow inner gate segment 204, field gate segments 206a and 206b, source region 208, drain region 210, active region 214, field region 216, interfaces 218a and 218b, and gate contact 220 in FIG. 2E generally correspond to the same features in FIGS. 2A-2D, and may have any implementations and advantages described above.

As shown in FIG. 2E, narrow inner gate segment 204 distant from interface 218a has width $W_1$ and wide outer gate segment 236 proximate to interface 218a has width $W_2$. It is noted that, in the present application, the term "width" used with respect to gate 202 may refer to the same direction as the term "length" used with respect to channel region 212, for example, as shown in FIGS. 2C and 2D. Width $W_2$ of wide outer gate segment 236 is greater than width $W_1$ of narrow inner gate segment 204, as described above. In various implementations, width $W_2$ may be wider or narrower with respect to width $W_1$ than shown in FIG. 2E. For example, wide outer gate segment 236 may be approximately twenty percent to approximately fifty percent (20%-50%) wider than narrow inner gate segment 204, i.e., width $W_2$ may be approximately twenty percent to approximately fifty percent (20%-50%) greater than width $W_1$.

As also shown in FIG. 2E, field gate segment 206a has width $W_3$. Wide outer gate segment 236 is contiguous with field gate segment 206a situated over said field region 216. In the present implementation, field gate segment 206a has the same width as wide outer gate segment 236, i.e., width $W_3$ may be substantially equal to width $W_2$. In various implementations, width $W_3$ may be wider or narrower with respect to width $W_2$ than shown in FIG. 2E.

Wide outer gate segment 236 extends from interface 218a a distance $D_1$ over active region 214. Channel region 212 (shown in FIGS. 2B through 2D) is situated under gate 202 between source region 208 and drain region 210, and has width $W_4$. It is noted that, in the present application, the term "width" used with respect to channel region 212 or active region 214 may refer to the opposite direction as the term "width" used with respect to gate 202, for example, as shown in FIG. 2E. In various implementations, wide outer gate segment 236 extends from interface 218a and overlaps approximately ten percent to approximately fifty percent (10%-50%) of a width of channel region 212, i.e., distance $D_1$ may be approximately ten percent to approximately fifty percent (10%-50%) of width $W_4$.

In the present implementation, narrow inner gate segment 204 and wide outer gate segment 236 are substantially rectangular shaped. Narrow inner gate segment 204 and wide outer gate segment 236 are also substantially centered or aligned with each other. Each side of wide outer gate segment 236 protrudes a distance $D_2$ from a corresponding side of narrow inner gate segment 204. In various implementations, narrow inner gate segment 204 and wide outer gate segment 236 may have other shapes and/or alignments, and wide outer gate segment 236 may protrude distances other than those shown in FIG. 2E relative to inner gate segment 204.

Figure 3:
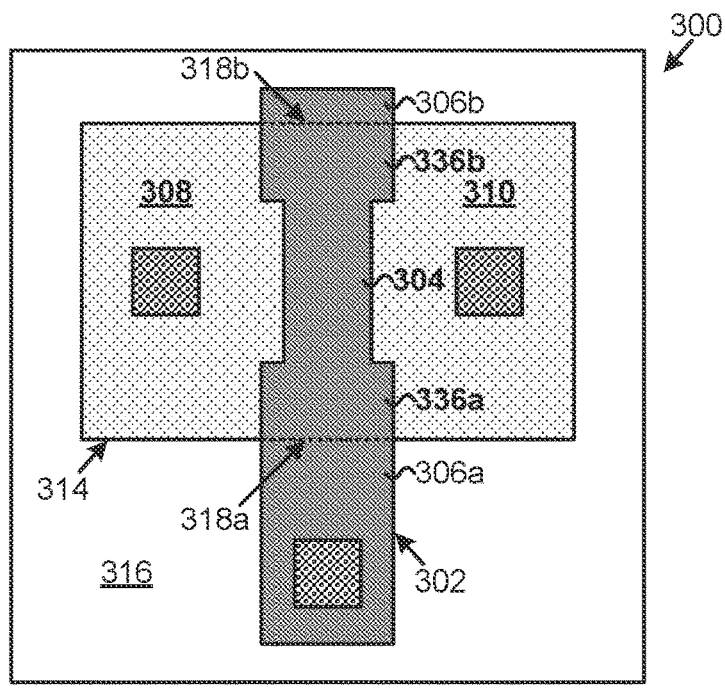
FIG. 3 illustrates an exemplary plan view of a FET according to one implementation of the present application.

FIG. 3 illustrates an exemplary plan view of FET 300 according to one implementation of the present application. FET 300 in FIG. 3 represents an implementation of the present application different from FET 200 in FIGS. 2A through 2E. Except for differences noted below, FET 300, gate 302, narrow inner gate segment 304, field gate segments 306a and 306b, source region 308, drain region 310, active region 314, field region 316, interfaces 318a and 318b, gate contact 320, source contact 322, drain contact 324, and first wide outer gate segment 336a in FIG. 3 generally correspond to FET 200, gate 202, narrow inner gate segment 204, field gate segments 206a and 206b, source region 208, drain region 210, channel region 212, active region 214, field region 216, interfaces 218a and 218b, gate contact 220, source contact 222, drain contact 224, and wide outer gate segment 236 in FIGS. 2A through 2D, and may have any implementations and advantages described above.

As shown in FIG. 3, gate 302 of FET 300 includes first wide outer gate segment 336a proximate to first interface 318a, and an additional second wide outer gate segment 336b proximate to second interface 318b. Narrow inner gate segment 304 is distant from both first interface 318a and second interface 318b. That is, wide outer gate segments 336a and 336b are situated over opposite edges of active region 314, with narrow inner gate segment 304 therebetween. Similar to first wide outer gate segment 336a, the width second wide outer gate segment 336b is greater than the width of narrow inner gate segment 304.

Field gate segment 306b in FIG. 3 is also wider compared to field gate segment 206b in FIGS. 2A and 2E. In the implementation of FIG. 3, second wide outer gate segment 336b is contiguous with, and has the same width as, field gate segment 306b situated over said field region 316. In various implementations, field gate segment 306b may be wider or narrower with respect to second wide outer gate segment 336b than shown in FIG. 3. In one implementation, field gate segment 306b may serve as a landing pad for an additional gate contact (not shown in FIG. 3).

In the present implementation, first wide outer gate segment 336a and second wide outer gate segment 336b are substantially symmetric, having the substantially same shape, width, and length. However, in various implementation, first wide outer gate segment 336a and second wide outer gate segment 336b may be asymmetric. For example, first wide outer gate segment 336a may have a different shape, width, and/or length than second wide outer gate segment 336b, such as in implementations where geometries of active region 314 are asymmetric.

Figure 4:
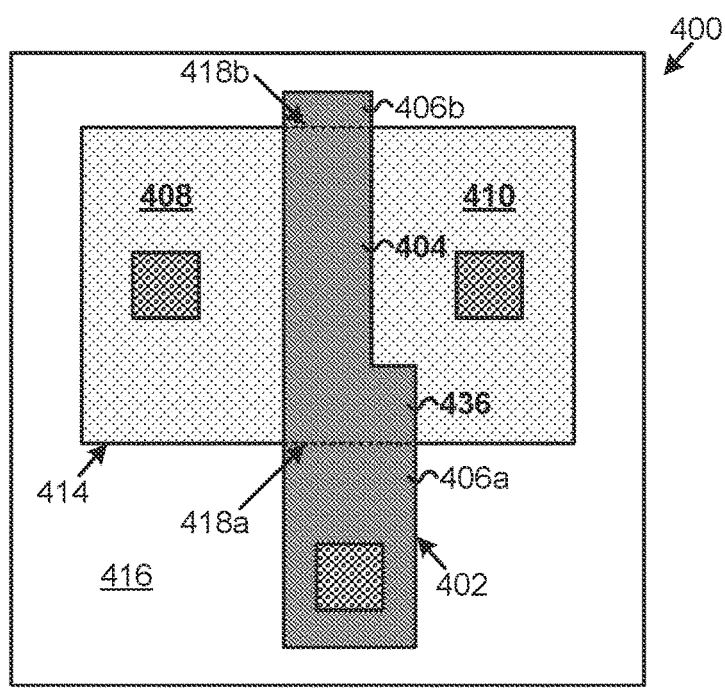
FIG. 4 illustrates an exemplary plan view of a FET according to one implementation of the present application.

FIG. 4 illustrates an exemplary plan view of FET 400 according to one implementation of the present application. FET 400 in FIG. 4 represents an implementation of the present application different from FET 200 in FIGS. 2A through 2E. Except for differences noted below, FET 400, gate 402, narrow inner gate segment 404, field gate segments 406a and 406b, source region 408, drain region 410, active region 414, field region 416, interfaces 418a and 418b, gate contact 420, source contact 422, drain contact 424, and wide outer gate segment 436 in FIG. 4 generally correspond to FET 200, gate 202, narrow inner gate segment 204, field gate segments 206a and 206b, source region 208, drain region 210, channel region 212, active region 214, field region 216, interfaces 218a and 218b, gate contact 220, source contact 222, drain contact 224, and wide outer gate segment 236 in FIGS. 2A through 2D, and may have any implementations and advantages described above.

As shown in FIG. 4, wide outer gate segment 436 proximate to interface 418a is offset with respect to narrow inner gate segment 404 distant from interface 418a. As used in the present application, "offset" refers to wide outer gate segment 436 not sharing line of symmetry with narrow inner gate segment 404, or not being center-aligned with narrow inner gate segment 404. In the present implementation, wide outer gate segment 436 and narrow inner gate segment 404 are substantially rectangular, and a first side of wide outer gate segment 436 is substantially flush with a corresponding side of narrow inner gate segment 404, while a second side of wide outer gate segment 436 protrudes a distance from a corresponding side of narrow inner gate segment 404. In another implementation, the first side of wide outer gate segment 436 may also protrude from the corresponding side of narrow inner gate segment 404, albeit protruding a different distance than the second side of wide outer gate segment 436.

It is noted that the present invention may be implemented in various manners not specifically illustrated in the drawings. As a first example, a FET may have first and second wide outer gate segments on opposite edges of active region, where both first and second wide outer gate segments are offset with respect to a narrow inner gate segment. As a second example, although the drawings illustrate FETs with floating bodies, a FET may have a body contacted region. Since leakage effects between source and drain regions near a body contacted region are generally lessened, a wide outer gate segment may be formed opposite the body contacted region across the active region. As a third example, a FET may include a digitated gate, and wide outer gate segments may be formed on fingers of the digitated gate.

Figure 5:
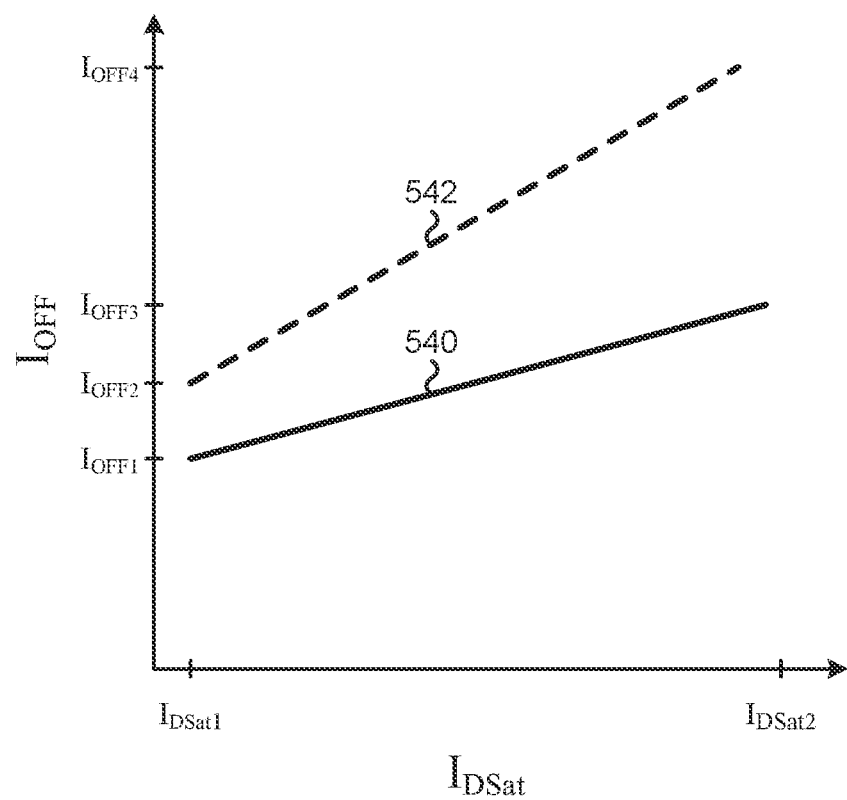
FIG. 5 illustrates an exemplary graph of leakage current versus saturation drain current according to one implementation of the present application.

FIG. 5 illustrates an exemplary graph of leakage current ($I_{OFF}$) versus saturation drain current ($I_{DSat}$) according to one implementation of the present application. In the graph, the y-axis, $I_{OFF}$, represents a leakage current of a FET during an OFF state. Generally, a FET with lower $I_{OFF}$ is more desirable. In the graph, the x-axis, $I_{DSat}$, represents an operating current of a FET during a saturation mode. A FET generally exhibits a tradeoff between $I_{OFF}$ and $I_{DSat}$. Trace 540 represents the $I_{OFF}$ of a FET according to the present application, such as FET 200 in FIGS. 2A through 2E using wide outer gate segment 236, plotted over various $I_{DSat}$ values. Trace 542 represents the $I_{OFF}$ of an exemplary FET, such as FET 100 in FIGS. 1A through 1D.

As shown by traces 540 and 542 in FIG. 5, at a first saturation drain current $I_{DSat1}$, FET 200 in FIGS. 2A through 2E experiences lower leakage current $I_{OFF1}$, and FET 100 in FIGS. 1A through 1D experiences higher leakage current $I_{OFF2}$. In one implementation, $I_{OFF1}$ may be approximately twenty percent (20%) less than $I_{OFF2}$. As the saturation drain current increases from $I_{DSat1}$ to $I_{DSat2}$, the leakage current of both FETs increases. However, the leakage current of the exemplary FET 100 in FIGS. 1A through 1D increases much more significantly. At a second saturation drain current $I_{DSat2}$, FET 200 in FIGS. 2A through 2E experiences lower leakage current $I_{OFF3}$, and FET 100 in FIGS. 1A through 1D experiences higher leakage current $I_{OFF4}$. In one implementation, $I_{OFF3}$ may be approximately twenty percent (50%) less than $I_{OFF3}$. As shown in FIG. 5, FET 200 in FIGS. 2A through 2E generally experiences lower leakage current than FET 100 in FIGS. 1A through 1D at all saturation drain current values. It is noted that traces 540 and 542 are merely exemplary and may exhibit different patterns or slopes than shown in FIG. 5.

FETs according to the present invention, such as FET 200 in FIGS. 2A through 2E, result in numerous advantages, some of which are stated below. First, since FET 200 includes wide outer gate segment 236 proximate to interface 218a of channel region 212 with field region 216, channel region 212 under wide outer gate segment 236 and interface 218a are also wider. Wide outer gate segment 236 produces an outer channel length $L_2$ greater than an inner channel length $L_1$ that is produced from narrow inner gate segment 204. A direct conductive path formed at interface 218a will be longer, thereby reducing a leakage current of FET 200 during an OFF state. Accordingly, FET 200 advantageously exhibits decreased power consumption, for example, where FET 200 is implemented in a digital block.

Second, the present invention can be implemented on conventional SOI structures, making the invention suitable for large scale production without premium costs associated with specialty substrates. Leakage current is particularly concerning for SOI device structures due to their use of thin semiconductor layers over BOX layers. Accordingly, the advantages above are compounded for FETs implemented on SOI structures.

Third, wide outer gate segment 236 can overlap a width of channel region 212 allowing for misalignment tolerance, and more reliable reduction of leakage current. The overlap distance ($D_1$ in FIG. 2E) can be increased for greater protection against misalignment.

Fourth, wide outer gate segment 236 may be contiguous with, and have the same width as, field gate segment 206a situated over field region 216 and functioning as a landing pad for gate contact 220. Since a landing pad for gate contact 220 is generally wider than narrow inner gate segment 204, the width of wide outer gate segment 236 and the width of field gate segment 206a ($W_2$ and $W_3$ respectively in FIG. 2E) can be chosen to be the same for design simplification.

Fifth, the present invention may implement wide outer gate segments in various manners, allowing the versatility to suit different FET designs, as described above. For example, FET 300 in FIG. 3 can implement an additional wide outer gate segment 336b to further reduce leakage current.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:
1. A field effect transistor (FET) comprising:
    an active region including a source region, a drain region, and a channel region, said channel region under a gate and situated between said source region and said drain region;
    a field region next to said active region, said channel region having an interface with said field region;

said gate having a wide outer gate segment proximate to said interface and a narrow inner gate segment distant from said interface;

said wide outer gate segment producing an outer channel length greater than an inner channel length produced from said narrow inner gate segment, thereby reducing a leakage current of said FET during an OFF state.

2. The FET of claim 1, wherein said field region comprises a shallow trench isolation (STI) region.

3. The FET of claim 1, wherein said field region comprises a local oxidation of silicon (LOCOS) region.

4. The FET of claim 1, wherein said field region comprises a thermally grown oxide region.

5. The FET of claim 1, wherein said wide outer gate segment is contiguous with a field gate segment situated over said field region, said field gate segment having a same width as said wide outer gate segment.

6. The FET of claim 1, wherein said wide outer gate segment is approximately twenty percent to approximately fifty percent wider than said narrow inner gate segment.

7. The FET of claim 1, wherein said wide outer gate segment extends from said interface and overlaps approximately ten percent to approximately fifty percent of a width of said channel region.

8. The FET of claim 1, wherein said wide outer gate segment is substantially rectangular.

9. The FET of claim 1, wherein said wide outer gate segment is offset with respect to said narrow inner gate segment.

10. The FET of claim 1, wherein said active region is situated in a semiconductor layer situated over a buried oxide layer, said buried oxide layer being situated over a substrate.

11. A field effect transistor (FET) comprising:
a channel region under a gate of said FET;
said channel region having an interface with a field region;
said gate having a wide outer gate segment proximate to said interface and a narrow inner gate segment distant from said interface;
said wide outer gate segment producing an outer channel length greater than an inner channel length produced from said narrow inner gate segment.

12. The FET of claim 11, wherein said field region comprises a shallow trench isolation (STI) region.

13. The FET of claim 11, wherein said field region comprises a local oxidation of silicon (LOCOS) region.

14. The FET of claim 11, wherein said field region comprises a thermally grown oxide region.

15. The FET of claim 11, wherein said wide outer gate segment is contiguous with a field gate segment situated over said field region, said field gate segment having a same width as said wide outer gate segment.

16. The FET of claim 11, wherein said wide outer gate segment is approximately twenty percent to approximately fifty percent wider than said narrow inner gate segment.

17. The FET of claim 11, wherein said wide outer gate segment extends from said interface and overlaps approximately ten percent to approximately fifty percent of a width of said channel region.

18. The FET of claim 11, wherein said wide outer gate segment is substantially rectangular.

19. The FET of claim 11, wherein said wide outer gate segment is offset with respect to said narrow inner gate segment.

* * * * *